US011320314B2

(12) United States Patent
Gruner et al.

(10) Patent No.: US 11,320,314 B2
(45) Date of Patent: May 3, 2022

(54) METHOD AND DEVICE FOR DETERMINING THE HEATING STATE OF AN OPTICAL ELEMENT IN AN OPTICAL SYSTEM FOR MICROLITHOGRAPHY

(71) Applicants: Carl Zeiss SMT GmbH, Oberkochen (DE); Maria Gonano Beurer, Ulm (DE)

(72) Inventors: Toralf Gruner, Aalen-Hofen (DE); Joachim Hartjes, Aalen (DE); Markus Hauf, Ulm (DE); Gerhard Beurer, Ulm (DE)

(73) Assignees: Carl Zeiss SMT GmbH, Oberkochen (DE); Maria Gonano Beurer, Ulm (DE)

( * ) Notice: Subject to any disclaimer, the term of this patent is extended or adjusted under 35 U.S.C. 154(b) by 0 days.

(21) Appl. No.: 17/155,697

(22) Filed: Jan. 22, 2021

(65) Prior Publication Data

US 2021/0148762 A1 May 20, 2021

Related U.S. Application Data

(63) Continuation of application No. PCT/EP2019/062631, filed on May 16, 2019.

(30) Foreign Application Priority Data

Jul. 25, 2018 (DE) .......................... 102018212400.0

(51) Int. Cl.
*G01J 5/0806* (2022.01)
*G03F 7/20* (2006.01)
(Continued)

(52) U.S. Cl.
CPC ............. *G01J 5/0806* (2013.01); *G01J 5/084* (2013.01); *G01J 5/10* (2013.01); *G02B 5/001* (2013.01);
(Continued)

(58) Field of Classification Search
CPC .............. G03F 7/70341; G03F 7/7085; G03F 7/70891; G02B 27/0955; G02B 7/04; G02B 5/001; G01J 5/084; G01J 5/10
(Continued)

(56) References Cited

U.S. PATENT DOCUMENTS

| 5,388,909 A | * | 2/1995 | Johnson | ................. G01K 11/14 356/44 |
| 8,454,230 B2 | | 6/2013 | Melzer et al. | |

(Continued)

FOREIGN PATENT DOCUMENTS

| DE | 25 08 494 A1 | 9/1976 |
| DE | 36 05 737 A1 | 8/1987 |

(Continued)

OTHER PUBLICATIONS

Translation of International Search Report for corresponding Appl No. PCT/EP2019/062631, dated Jul. 25, 2019.
(Continued)

*Primary Examiner* — Hung Nguyen
(74) *Attorney, Agent, or Firm* — Fish & Richardson P.C.

(57) ABSTRACT

A method and an apparatus for determining the heating state of an optical element in a microlithographic optical system involves at least one contactless sensor which is based on the reception of electromagnetic radiation from the optical element. The radiation range captured by the sensor is varied for the purposes of ascertaining a temperature distribution in the optical element.

20 Claims, 7 Drawing Sheets

(51) Int. Cl.
  *G01J 5/08*   (2022.01)
  *G01J 5/10*   (2006.01)
  *G02B 5/00*   (2006.01)
  *G02B 7/04*   (2021.01)
  *G02B 27/09*  (2006.01)

(52) U.S. Cl.
  CPC ........... *G02B 7/04* (2013.01); *G02B 27/0955* (2013.01); *G03F 7/7085* (2013.01); *G03F 7/70891* (2013.01)

(58) Field of Classification Search
  USPC .................................................... 355/30, 67
  See application file for complete search history.

(56) References Cited

U.S. PATENT DOCUMENTS

| | | | |
|---|---|---|---|
| 10,146,138 | B2 | 12/2018 | Hild et al. |
| 10,784,295 | B2 * | 9/2020 | Kubo ................... H04N 5/2253 |
| 2006/0222044 | A1 | 10/2006 | Melzer et al. |
| 2009/0257032 | A1 | 10/2009 | Eva et al. |
| 2010/0200777 | A1 | 8/2010 | Hauf |
| 2012/0127440 | A1 | 5/2012 | Major |
| 2013/0176544 | A1 * | 7/2013 | Hauf ..................... G02B 7/181 355/30 |

FOREIGN PATENT DOCUMENTS

| | | |
|---|---|---|
| DE | 10 2005 004 460 A1 | 8/2006 |
| DE | 10 2006 045 075 A1 | 4/2008 |
| DE | 10 2011 081 259 A1 | 3/2012 |
| DE | 10 2013 215 197 A1 | 6/2014 |
| DE | 10 2018 207 126 A1 | 6/2018 |
| JP | H02-181416 A | 7/1990 |
| WO | WO 2020/064223 A1 | 4/2020 |

OTHER PUBLICATIONS

GPTO-Office Action, with translation thereof, for corresponding DE 10 2018 212 400.0, dated Mar. 14, 2019.

International Preliminary Report on Patentability, with translation thereof, for corresponding Appl No. PCT/EP2019/062631, dated Feb. 4, 2021.

* cited by examiner

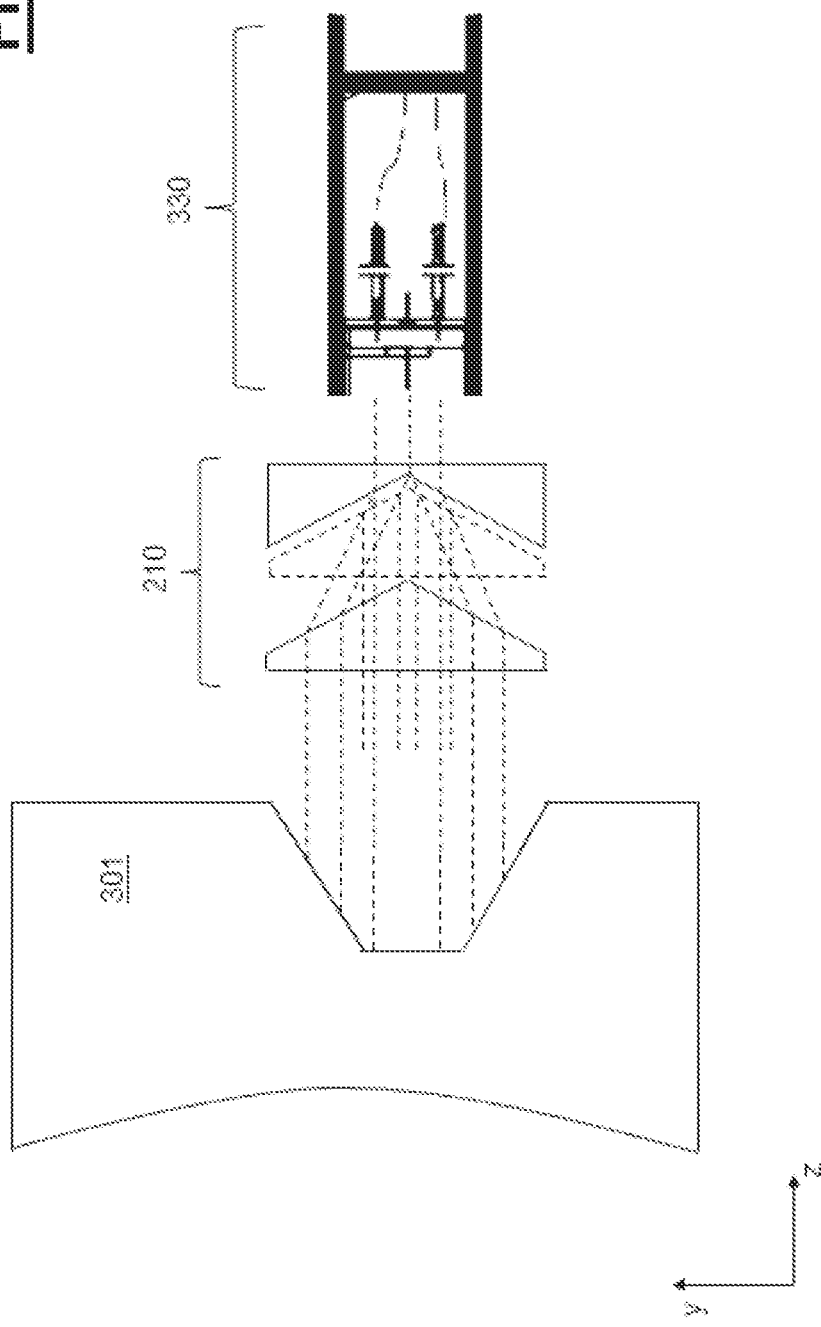

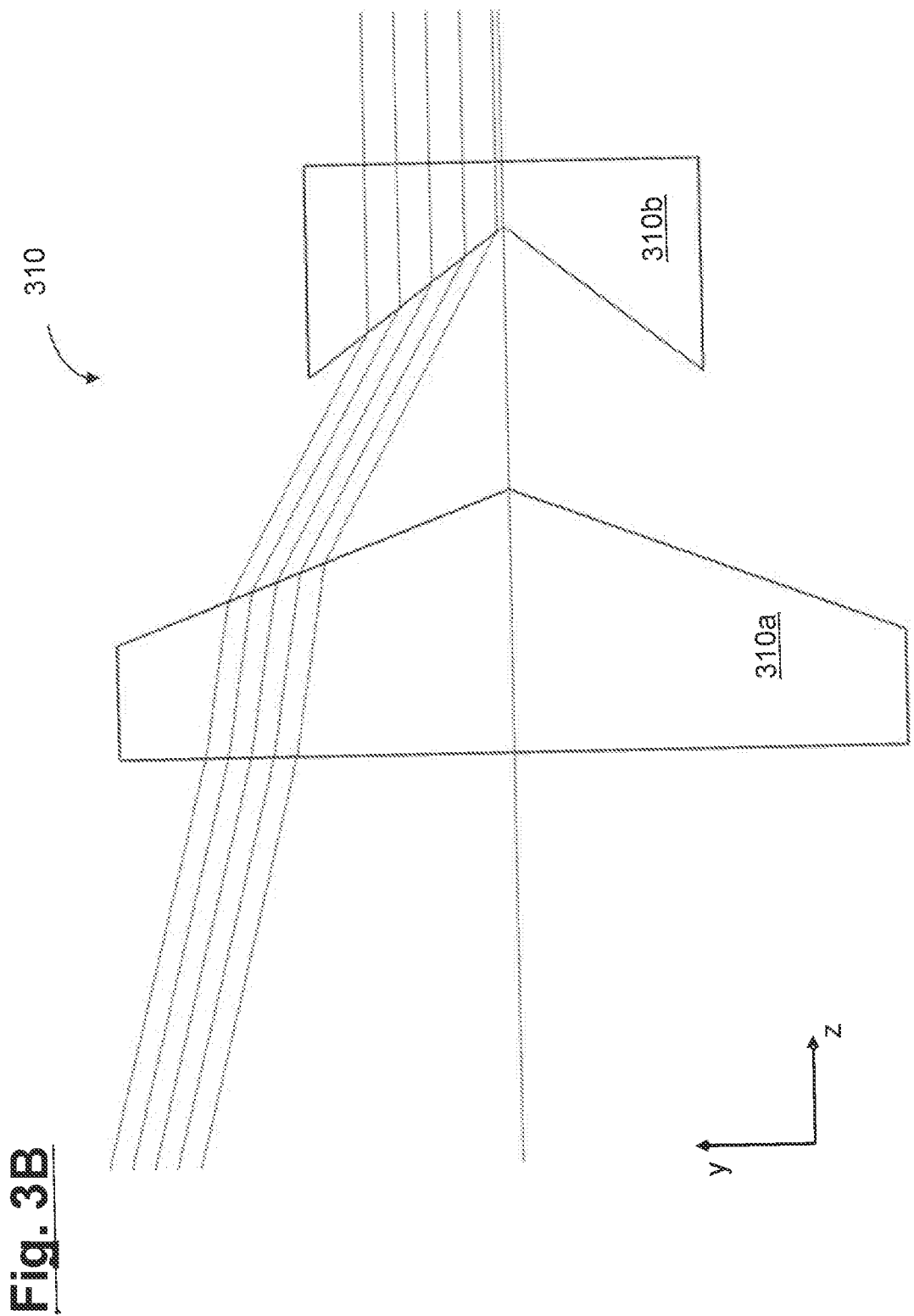

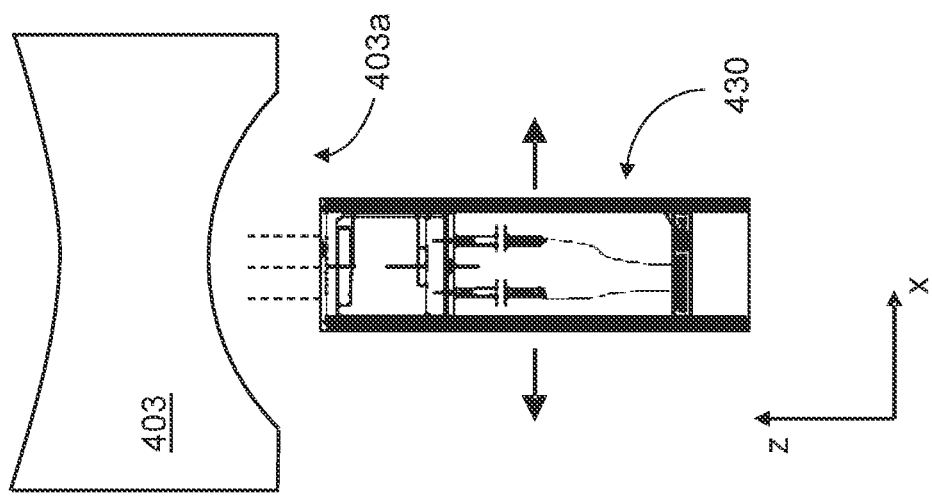
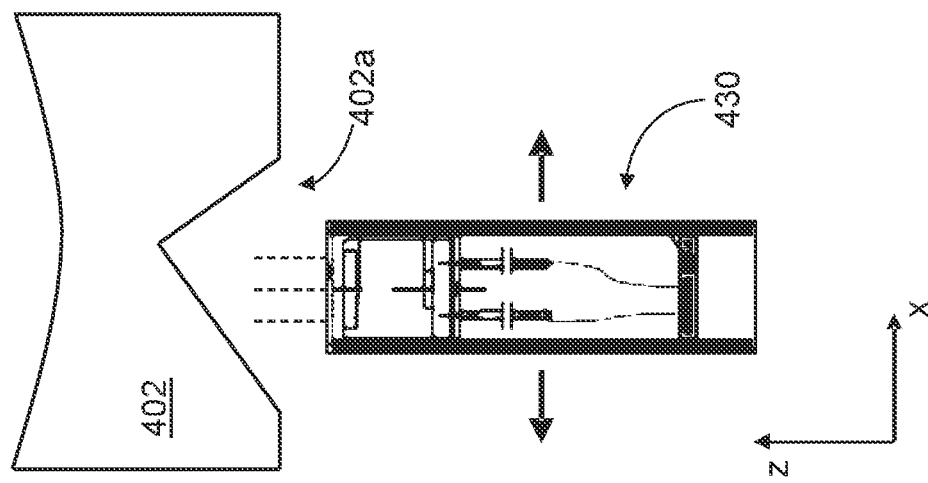
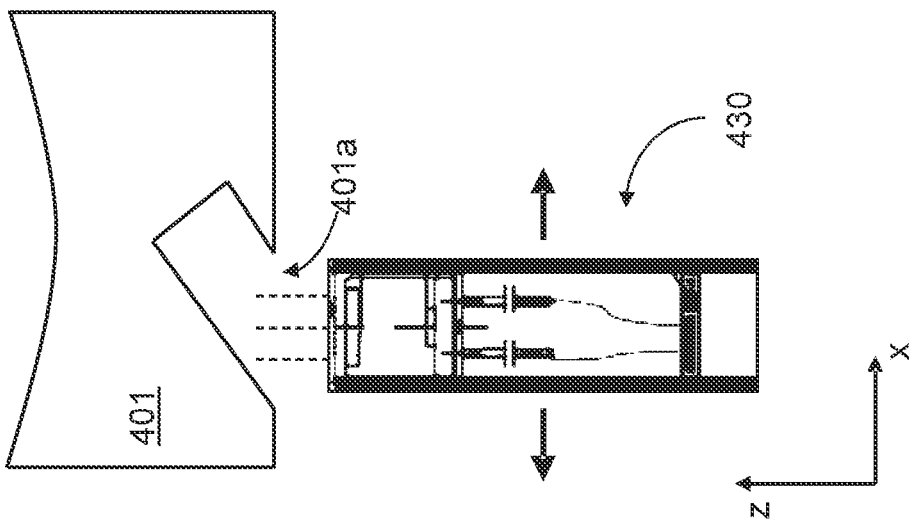

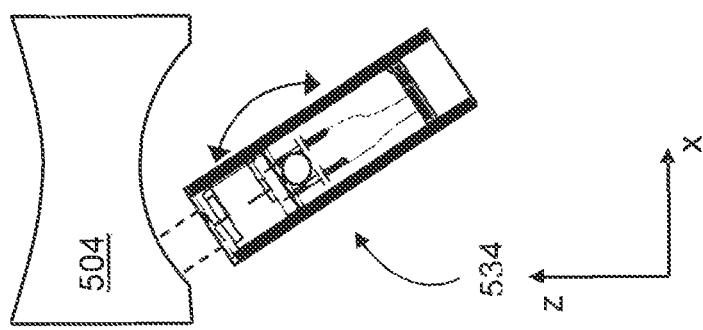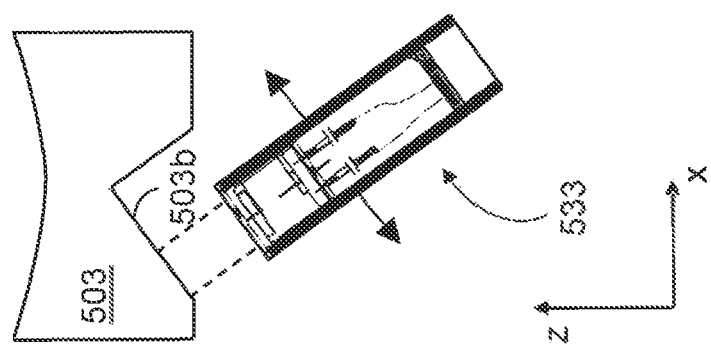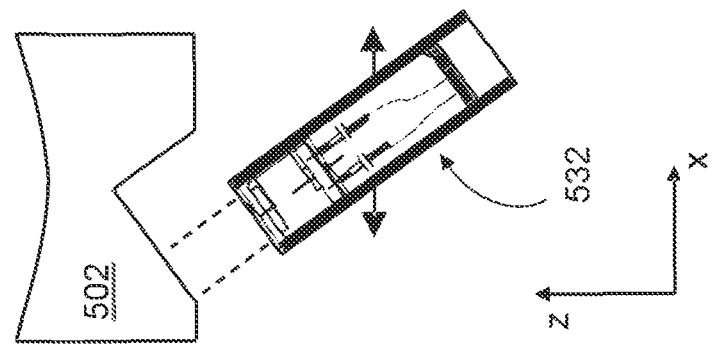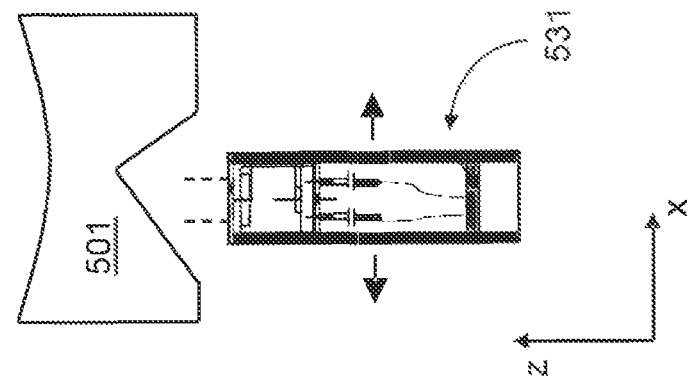

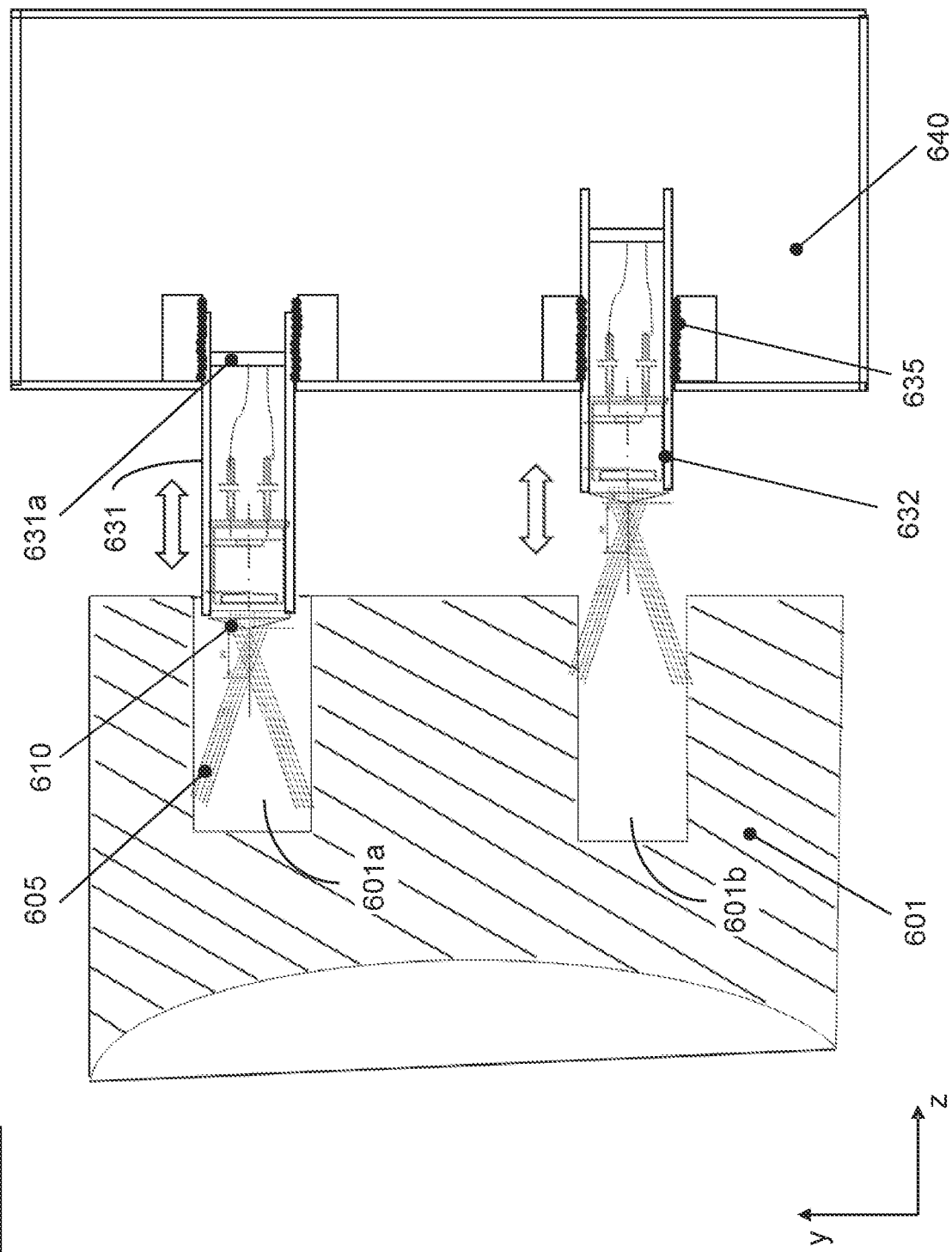

METHOD AND DEVICE FOR DETERMINING THE HEATING STATE OF AN OPTICAL ELEMENT IN AN OPTICAL SYSTEM FOR MICROLITHOGRAPHY

CROSS-REFERENCE TO RELATED APPLICATIONS

The present application is a continuation of, and claims benefit under 35 USC 120 to, international application PCT/EP2019/062631, filed May 16, 2019, which claims benefit under 35 USC 119 of German Application No. 10 2018 212 400.0, filed Jul. 25, 2018. The content of this DE application is incorporated by reference into the present application text.

FIELD

The disclosure relates to a method and an apparatus for determining the heating state of an optical element in a microlithographic optical system.

BACKGROUND

Microlithography is used for production of microstructured components, such as integrated circuits or LCDs, for example. The microlithography process is carried out in an installation known as a projection exposure apparatus, which includes an illumination device and a projection lens. The image of a mask (=reticle) illuminated via the illumination device is in this case projected via the projection lens onto a substrate (e.g. a silicon wafer) that is coated with a light-sensitive layer (photoresist) and arranged in the image plane of the projection lens in order to transfer the mask structure to the light-sensitive coating of the substrate.

In projection lenses designed for the EUV range, i.e., at wavelengths of, e.g., approximately 13 nm or approximately 7 nm, mirrors are typically used as optical components for the imaging process owing to the general lack of availability of suitable light-transmissive refractive materials. As a result of absorption of the radiation emitted by the EUV light source among other reasons, the EUV mirrors can heat up and undergo an associated thermal expansion or deformation, which in turn can negatively affect the imaging properties of the optical system.

One known way of taking this effect into account is to use a material with ultra-low thermal expansion ("Ultra Low Expansion Material"), for example a titanium silicate glass sold by Corning Inc. with the name ULE™, as the mirror substrate material and to set what is known as the zero-crossing temperature in a region near the optical effective surface. At this zero-crossing temperature, which lies at around $\vartheta=30°$ C. for example for ULE™, the coefficient of thermal expansion, in its temperature dependence, has a zero crossing in the vicinity of which no thermal expansion or only negligible thermal expansion of the mirror substrate material takes place.

However, an EUV mirror is usually exposed during operation of the microlithographic projection exposure apparatus to changing intensities of the incident electromagnetic radiation, specifically both locally, for example due to the use of illumination settings with an intensity that varies over the optical effective surface of the respective EUV mirror, and also temporally, wherein the relevant EUV mirror typically heats up in particular at the beginning of the microlithographic exposure process from a comparatively low temperature to its operating temperature reached in the lithography process.

One approach for addressing this and in particular for avoiding surface deformations caused by varying introductions of heat into an EUV mirror and associated optical aberrations includes the use of pre-heaters for example on the basis of infrared radiation. With such pre-heaters, active mirror heating can take place in phases of comparatively low absorption of useful EUV radiation, wherein the active mirror heating is correspondingly decreased as the absorption of the useful EUV radiation increases.

Regulation of the operation of such pre-heaters that is performed with the goal of maintaining a mirror temperature that is as constant as possible (typically the above-mentioned zero-crossing temperature) uses knowledge of the radiant power that is incident in each case on the relevant mirror so that the pre-heating power can be adapted accordingly. For this purpose, temperature sensors are used (in addition to infrared cameras which are not always practical due to installation space), for example in the form of thermocouples or (e.g. NTC) temperature sensors based on electrical resistance, which can be mounted typically in a force-fitting or cohesive manner at different positions of the respective mirror.

By mounting such thermocouples, however, it is possible to induce undesirable mechanical stresses in the mirror substrate, wherein in addition—in particular when a multiplicity of temperature sensors are used for ascertaining a spatially varying temperature distribution within the mirror—the production complexity is significantly increased and possibly the mechanical stability of the mirror is impaired.

Regarding disclosures, reference is made merely by way of example to DE 36 05 737 A1 and DE 10 2005 004 460 A1.

SUMMARY

The present disclosure seeks to provide a method and an apparatus for determining the heating state of an optical element in a microlithographic optical system, which enable knowledge of the heating state that is as relatively accurate while avoiding the above-described problems.

In an aspect, the disclosure provides a method for determining the heating state of an optical element in a microlithographic optical system, wherein use is made of at least one contactless sensor which is based on the reception of electromagnetic radiation from the optical element, and wherein the radiation range captured by the sensor is varied for the purposes of ascertaining the temperature distribution in the optical element.

In aspects, the disclosure is based on the concept of realizing a contactless determination of the heating state of a lithographic optical element using a contactless sensor which is based on the reception of electromagnetic radiation or thermal radiation from the optical element. Here, according to the disclosure, a pinpoint temperature measurement—possible, for example, using the thermocouples attached to the mirror or NTC sensors—can be deliberately dispensed with and, moreover, a possibly increased outlay in terms of equipment and a desire for increased for installation space, for example for the use of a pyrometer, are accepted.

In return, firstly, the introduction of mechanical stresses into the optical element or the mirror accompanied by the conventional use of, e.g., the thermocouples or NTC sensors is avoided according to the disclosure. Secondly, it is also possible—as will be explained in more detail below—to use the concept according to the disclosure of using a contactless radiation-based sensor in conjunction with a variation—realizable in different embodiments—of the radiation range captured by this sensor to ascertain a (typically locally variable) temperature distribution in the optical element, wherein this temperature distribution can already be ascertained by one or only a few contactless sensors on account of the "zonal sensing" of the optical element (e.g., as is achievable in optical and/or mechanical fashion as described below).

As a consequence of the use according to the disclosure of a contactless radiation-based sensor, it can be possible to dispense with all mechanical manipulations on the optical element that is to be measured in respect of its heating state. In further embodiments of the disclosure, it is however also possible to additionally design the geometry of one or more (in particular refractive) surfaces on the optical element (e.g., on a back side of the mirror) in targeted fashion, in order, for example, in combination with a lateral and/or axial movement of the contactless radiation-based the sensor in relation to the mirror, to additionally assist the zonal sensing of the mirror in a suitable manner. In particular, according to the disclosure, at least one cutout or recess and/or at least one elevated structure can be provided in the optical element on the side facing the sensor, with the consequence that, e.g., in conjunction with a lateral movement of the contactless radiation-based sensor, (thermal) radiation from the different "elevations" of the optical element reaches the sensor.

In principle, the signal captured by the contactless sensor according to the disclosure can represent a superposition signal from the contributions of different regions of the optical element—in contrast to the substantially pinpoint information obtained with, for instance, a thermocouple or an NTC temperature sensor. Nevertheless, a spatial temperature distribution in the optical element with high spatial resolution can be ascertained according to the disclosure on the basis of a simulation and/or by comparison with calibration measurements carried out in advance and on the basis of a model.

According to some embodiments, the variation of the radiation region captured by the sensor is implemented using a beam shaping optical unit situated between the optical element and the sensor. Zonal sensing of the optical element can be realized by this variation.

According to some embodiments, the beam shaping optical unit includes a zoom-axicon system. In certain embodiments of the beam shaping optical unit, one or more optical elements with a suitable (e.g., wedge-shaped or cylindrical) geometry, which are arranged to be displaceable and/or rotatable (in particular also relative to one another), can be used between the optical element and the contactless sensor for the purposes of varying the radiation region captured by the sensor.

According to some embodiments, the variation of the radiation region captured by the sensor includes a manipulation of the relative position between the optical element and the sensor.

According to some embodiments, the optical element is a mirror.

According to some embodiments, the optical element is designed for an operating wavelength of less than 30 nm, such as less than 15 nm.

On the basis of the determination of the heating state, there is, according to some embodiments, preheating of the optical element for the at least partial compensation of changes of the heating state of the optical element over time, which occur during the operation of the optical system. In certain embodiments, compensation of optical aberrations caused by the heating state in the optical system can also be performed by way of suitable manipulators (for example adaptive mirrors). Alternatively or in addition, correspondingly compensating changes in the gas pressure, the radiation intensity, the radiation wavelength and/or the illumination setting in the respective optical system can also be performed here.

According to some embodiments, the determination of the heating state is performed during the operation of the optical system (for example of a microlithographic projection exposure apparatus).

In an aspect, the disclosure provides an apparatus for determining the heating state of the mirror in an optical system, in particular in a microlithographic projection exposure apparatus, wherein the apparatus includes at least one contactless sensor based on the reception of electromagnetic radiation from the optical element and a device for varying the radiation region captured by the sensor.

For example, the apparatus can be configured to carry out a method having the above-described features. With regard to aspects, features and configurations of the apparatus, reference is made to the above explanations in association with the method according to the disclosure.

Further configurations of the disclosure can be gathered from the description and the dependent claims. The disclosure is explained in greater detail below on the basis of exemplary embodiments illustrated in the accompanying figures.

BRIEF DESCRIPTION OF THE DRAWINGS

In the figures:

FIGS. 2A-2B, 3A-3B, 4A-4C, 5A-5D and 6 are schematic illustrations for explaining possible embodiments of the method or apparatus according to the disclosure.

DESCRIPTION OF EXEMPLARY EMBODIMENTS

Figure 1:
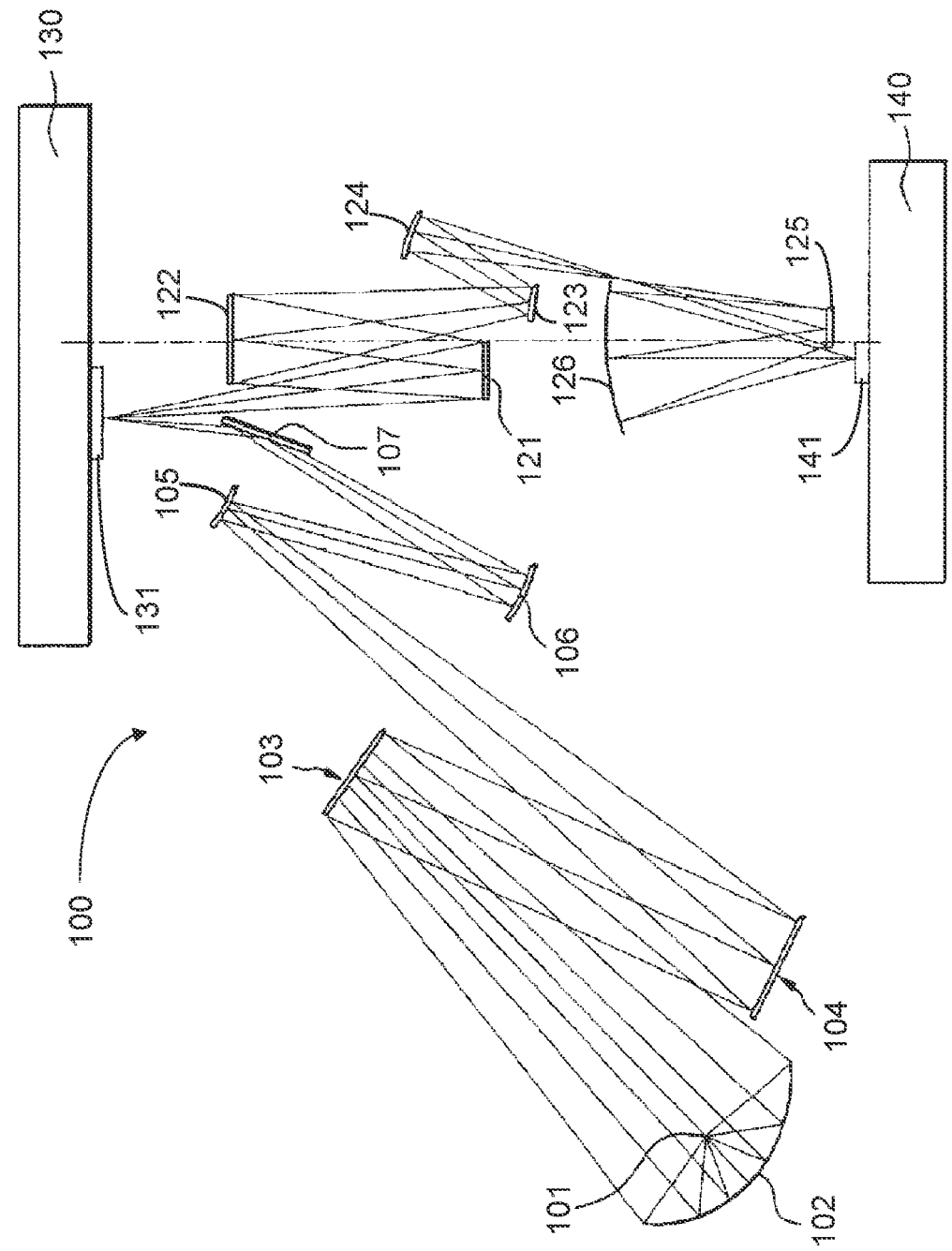
FIG. 1 is a schematic illustration of the possible construction of a microlithographic projection exposure apparatus designed for operation in the EUV.
Figure 2A:
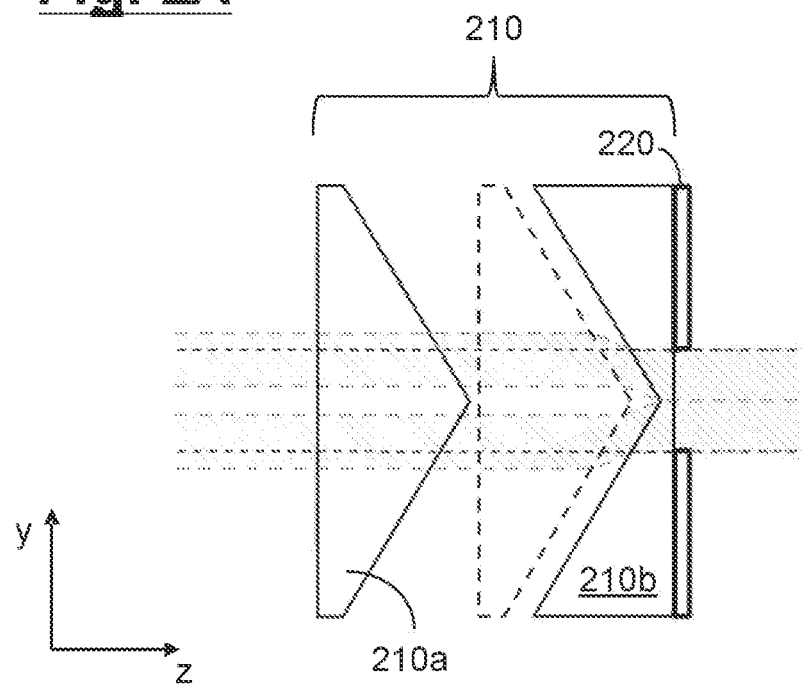
Figure 2B:
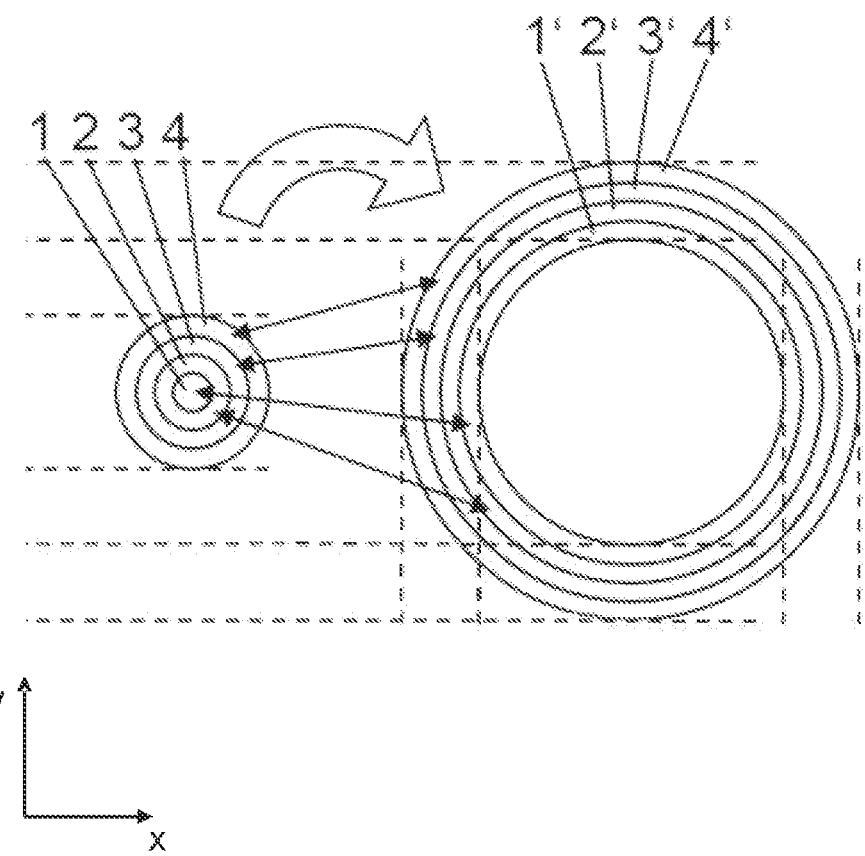

FIG. 1 shows a schematic illustration of a projection exposure apparatus 100 which is designed for operation in the EUV and in which the disclosure is realizable by way of example.

According to FIG. 1, an illumination device of the projection exposure apparatus 100 includes a field facet mirror 103 and a pupil facet mirror 104. The light from a light source unit including an EUV light source (plasma light source) 101 and a collector mirror 102 in the example is directed onto the field facet mirror 103. A first telescope mirror 105 and a second telescope mirror 106 are arranged in the light path downstream of the pupil facet mirror 104. A deflection mirror 107 is arranged downstream in the light path, the deflection mirror directing the radiation that is incident thereon onto an object field in the object plane of a projection lens including six mirrors 121-126. At the location of the object field, a reflective structure-bearing mask 131 is arranged on a mask stage 130, the mask being imaged with the aid of the projection lens into an image plane in which a substrate 141 coated with a light-sensitive layer (photoresist) is situated on a wafer stage 140.

During operation of the microlithographic projection exposure apparatus 100, the electromagnetic radiation that is incident on the optical effective face or on the face of incidence of the mirrors that are present is partially absorbed and, as explained in the introductory part, results in heating and an associated thermal expansion or deformation, which in turn can lead to an impairment of the imaging properties.

The method according to the disclosure, or the apparatus according to the disclosure, for determining the heating state of an optical element can in particular be used for example on any desired mirror of the microlithographic projection exposure apparatus 100 of FIG. 1.

Below, different embodiments of the method according to the disclosure and of the apparatus are described with reference to the schematic drawings in FIGS. 2a-6. What is common to these embodiments is that at least one contactless, radiation-based sensor is used in each case for determining the heating state.

Even though this contactless sensor is realized as a pyrometer in each of the exemplary embodiments described below, the disclosure is not restricted thereto. Other suitable contactless, radiation-based sensors, such as, e.g., IR photodiodes or photomultipliers, can also be used in further embodiments.

Furthermore, a variation of the radiation region captured by the relevant sensor is implemented in the embodiments described below on the basis of FIGS. 2a-6, in each case in combination with the contactless radiation-based sensor used according to the disclosure, in order, by way of zonal sensing of the optical element to be measured in respect of its heating state, to ascertain a typically locally varying temperature distribution within the optical element.

The above-described variation of the radiation region can be implemented optically by way of a suitable upstream optical unit in accordance with the embodiment of FIGS. 2A, 2B, 3A and 3B and, additionally or alternatively, mechanically or with manipulation of the relative position between the optical element and the contactless, radiation-based sensor in accordance with FIGS. 4A-4C, 5A-5D and 6.

The disclosure is not restricted to the embodiments illustrated in FIGS. 2A-6; in particular, configurations in which a variation of the radiation region captured by the contactless sensor according to the disclosure is realized in a different way (in particular, by way of any suitable optical and/or mechanical actuators) or in which such a variation is entirely dispensed with should also be considered to be encompassed by the present disclosure.

Referring again to FIGS. 2A, 2B, 3A and 3B, a zoom-axicon system 210 is situated in a first exemplary embodiment between an optical element 301 in the form of a mirror, which is to be measured in respect of its heating state, and a contactless, radiation-based sensor 330, which is configured as a pyrometer in the exemplary embodiment, the adjustment of the zoom-axicon system (indicated by dashed lines in FIG. 3A) achieving the effect that the (thermal) radiation incident at the contactless sensor or pyrometer 330 as per FIG. 3A originates from different regions (ring-shaped regions in the example according to FIG. 2B) of the optical element 301, with these regions being denoted by 1 to 4 or 1' to 4' in FIG. 2B for two different settings of the zoom-axicon system.

As a consequence of the above-described functionality of the upstream optical unit formed by the zoom-axicon system, zonal sensing of the optical element 301 and hence an ascertainment of the typically spatially varying temperature distribution in this element 301 are already facilitated using a single contactless sensor 330 (or at least using only a few sensors) since the aforementioned upstream optical unit facilitates a continuous variation of the radiation region captured by the sensor. In other words, what is achieved according to the disclosure is that different regions of the optical element 301 are captured in respect of the heating state or the respectively emitted thermal radiation using one and the same sensor 330 in a scanning procedure and the heating state or respectively emitted thermal radiation is projected onto the sensor 330.

In other embodiments, a variable (upstream) optical unit used between the optical element 301 and the contactless sensor 330 for varying the radiation region captured by the sensor 330 can also be realized in any other suitable way, for example by way of one or more displaceably and/or rotatably arranged optical elements (so-called "Alvarez" elements) with suitably curved optically refractive faces (e.g., of wedge-shaped or cylindrical geometry). Moreover, the elements can also be combined with a displaceable and/or rotatable stop (indicated in FIG. 2A and labeled "220") in order to restrict the region of the optical element 301 captured in respect of the detected radiation.

In the exemplary embodiment as per FIG. 3A, the optical element 301 or the mirror has a conical bore on its back side facing the sensor 330. Further embodiments of such bores, recesses or depressions on the optical element will be explained on the basis of FIGS. 4A-4C, 5A-5D and 6. However, the disclosure is not restricted to the specific configuration thereof, or even to the presence of bores, recesses or depressions on the optical element.

Even though the radiation captured by the sensor 330 is incident parallel to the optical axis (extending along the z-axis in the plotted coordinate system) on both the zoom-axicon system 210 and the sensor 330 in the embodiment of FIG. 3A, the disclosure is not restricted thereto. Thus, a deviating beam profile, e.g., a divergent beam profile, can also be realized in further embodiments by way of a suitable adaptation of the components of the zoom-axicon system 310.

FIG. 3B shows a further possible configuration of a zoom-axicon system 310, in which a conical bore or otherwise angled back side of the optical element is dispensed with. To this end, there is a targeted deviation from a mutually complementary form of the two elements 310a, 310b of the zoom-axicon system 310 by way of different angles of the apex or by an adapted curvature of the cross section at least one of the elements 310a, 310b of the zoom-axicon system 310.

According to the embodiment described on the basis of FIGS. 2A, 2B, 3A and 3B, there is, as a matter of principle, no need for a displacement of the contactless sensor 330 relative to the optical element of 301 for the purposes of ascertaining a spatially varying temperature distribution on account of the above-described functionality of the variable (upstream) optical unit. However, in addition or as an alternative to the above-described optical realization of the variation of the radiation region captured by the contactless sensor, it is possible to undertake a manipulation of the relative position between the respective optical element and the contactless sensor. To this end, FIGS. 4A-4C, 5A-5D and 6 show possible embodiments.

According to FIGS. 4A-4C, there is, in respect of an optical element 401 to 403 to measured in respect of its heating state, a respective sideways or lateral movement of a contactless sensor 430 (in the x-direction in relation to the plotted coordinate system), wherein these embodiments differ from one another in respect of the specific configuration of a (back) side, facing the sensor 430, of the respective optical element or mirror 401-403. Specifically, the optical element 401 has an oblique bore 401a, the optical element 402 has an oblique milled groove 402a and the optical element 403 has a circular cutout 403a.

FIGS. 5A to 5D show further exemplary embodiments of a relative movement between contactless sensor 531, 532, 533 or 534 and optical element 501, 502, 503, 504. Specifically, the sensor 531 is displaced parallel to the back side of the optical element 501 facing the sensor 531 (in the x-direction in relation to the plotted coordinate system) according to FIG. 5A, the sensor 532 inclined in relation to the x-direction is displaced in the x-direction according to FIG. 5B, the sensor 533 is displaced parallel to the surface 503b of the depression present in the optical element 503 in the optical element 503 according to FIG. 5C, and the sensor 534 is rotated about an axis parallel to the back side of the optical element 504 or with respect to the y-direction the plotted coordinate system according to FIG. 5D.

In further embodiments, the radiation emanating from the optical element to be measured in respect of its heating state can also be additionally or alternatively captured by way of one or more lateral contactless sensors (i.e., contactless sensors not facing the back side of the optical element of mirror).

FIG. 6 shows a schematic illustration of a further possible embodiment.

According to FIG. 6, two contactless sensors 631, 632 according to the disclosure are provided, in respect of an optical element 601 to be measured in respect of its heating state, at a housing 640 embodied as an encapsulated unit so as to be independently axially displaceable by way of electromechanical actuators 635. The displacement of the sensors 631, 632, which are connected to an electronics board 631a as per FIG. 6, is implemented in bores 601a, 601b present at the optical element or mirror 601 in each case, wherein the radiation region (indicated by "605") captured by the respective sensor 631 or 632 can be varied by the axial displacement. This mechanical variation of the captured radiation region can be implemented as an alternative or else in addition to the use of an optical variation (such as, for example, the upstream optical unit described on the basis of FIGS. 2A, 2B, 3A and 3B). An upstream optical unit 610 present as per FIG. 6 can also have a static configuration (i.e., without the adjustment possibility provided in the zoom-axicon system of FIGS. 2A, 2B, 3A and 3B).

In practice, a simulation can also be carried out in advance in all of the embodiments described above, which simulation yields the respective (superposition) signal to be expected at the contactless sensor or pyrometer for certain use scenarios of the optical element (e.g., certain radiation situations for a mirror). On the basis of this simulation, the heating state or certain irradiation situation can be deduced from a measurement signal actually obtained at the contactless sensor. Thereupon, preheating of the optical element for at least partly compensating changes in the heating state of the optical element over time can be carried out on the basis of the determination of the heating state.

Even though the disclosure has been described on the basis of specific embodiments, numerous variations and alternative embodiments will be apparent to a person skilled in the art, for example through combination and/or exchange of features of individual embodiments. Accordingly, it goes without saying for a person skilled in the art that such variations and alternative embodiments are also encompassed by the present disclosure, and the scope of the disclosure is only restricted as provided by the appended patent claims and the equivalents thereof.

What is claimed is:

1. A method for determining a heating state of an optical element in a microlithographic optical system, the microlithographic optical system comprising a beam shaping optical unit configured so that electromagnetic radiation from the optical element passes through the optical beam shaping optical unit before being received by a contactless sensor, the method comprising:
   i) varying the beam shaping optical unit to vary a region of the optical element from which electromagnetic radiation is received by the contactless sensor; and
   ii) after i), using the electromagnetic radiation from the optical element that is received by the contactless sensor to determine a temperature distribution in the optical element.

2. The method of claim 1, further comprising using the electromagnetic radiation from the optical element that is received by the contactless sensor to provide zonal sensing of the optical element.

3. The method of claim 1, wherein the beam shaping optical unit is between the optical element and the contactless sensor.

4. The method of claim 1, wherein the beam shaping optical unit comprises a zoom-axicon system.

5. The method of claim 1, wherein i) further comprises manipulating a relative position of the optical element and the contactless sensor.

6. The method of claim 1, wherein the optical element comprises, on a side of the optical element facing the contactless sensor, at least one member selected from the group consisting of a cutout, a depression and an elevated structure.

7. The method of claim 1, wherein the contactless sensor comprises a pyrometer.

8. The method of claim 1, wherein the optical element comprises a mirror.

9. The method of claim 1, wherein the optical element is configured for an operating wavelength of less than 30 nm.

10. The method of claim 1, further comprising, based on the determined temperature distribution of the optical element, preheating the optical element to at least partially compensate changes of a heating state of the optical element over time, which occur during the operation of the optical system.

11. The method of claim 1, further comprising, based on the determined temperature distribution of the optical element, preheating the optical element to at least partially compensate optical aberrations caused by changes of the heating state of the optical element.

12. The method of claim 1, further comprising determining the heating state of the optical element during the operation of the microlithographic optical system.

13. The method of claim 1, wherein the microlithographic optical system is a microlithographic projection exposure apparatus.

14. A system, comprising:
   an optical element;
   a contactless sensor configured to receive electromagnetic radiation from the optical element; and
   a beam shaping optical unit,
   wherein:
      the beam shaping optical unit is between the optical element and the contactless sensor so that electromagnetic radiation from the optical element passes through the beam shaping optical unit before being received by the contactless sensor; and the beam shaping optical system is configured so that varying the beam shaping optical unit varies a region of the optical element from which electromagnetic radiation is received by the contactless sensor.

15. An apparatus, comprising:
the system of claim 14,
wherein the apparatus comprises a member selected from the group consisting of a microlithographic illumination device and a microlithographic projection lens.

16. An apparatus, comprising:
the system of claim 14,
wherein the apparatus is a microlithographic projection exposure apparatus.

17. A method for determining a heating state of an optical element in a microlithographic optical system, the optical element comprising, on a side of the optical element facing a contactless sensor, at least one member selected from the group consisting of a cutout, a depression and an elevated structure, the method comprising:

i) varying a relative position of the at least one member and the contactless sensor to vary a region of the optical element from which electromagnetic radiation is received by the contactless sensor; and ii) after i), using the electromagnetic radiation from the optical element that is received by the contactless sensor to determine a temperature distribution in the optical element.

18. The method of claim 17, further comprising using the electromagnetic radiation from the optical element that is received by the contactless sensor to provide zonal sensing of the optical element.

19. The method of claim 17, wherein varying the electromagnetic radiation from the optical element that is received by the contactless sensor comprises manipulating a relative position of the optical element and the contactless sensor.

20. The method of claim 19, wherein the contactless sensor comprises a pyrometer.

* * * * *

UNITED STATES PATENT AND TRADEMARK OFFICE
CERTIFICATE OF CORRECTION

PATENT NO. : 11,320,314 B2
APPLICATION NO. : 17/155697
DATED : May 3, 2022
INVENTOR(S) : Toralf Gruner et al.

It is certified that error appears in the above-identified patent and that said Letters Patent is hereby corrected as shown below:

In the Specification

Column 6, Line 45, delete "at least" and insert -- at at least --;

Column 6, Line 61, after "to" insert -- be --;

Column 7, Line 16, delete "y-direction" and insert -- y-direction in --.

Signed and Sealed this
Twenty-eighth Day of June, 2022

Katherine Kelly Vidal
*Director of the United States Patent and Trademark Office*